United States Patent [19]

George

[11] 3,725,150

[45] Apr. 3, 1973

[54] PROCESS FOR MAKING A FINE GEOMETRY, SELF-ALIGNED DEVICE STRUCTURE

[75] Inventor: William L. George, Scottsdale, Ariz.

[73] Assignee: Motorola, Inc., Franklin Park, Ill.

[22] Filed: Oct. 29, 1971

[21] Appl. No.: 193,853

[52] U.S. Cl. ..................148/187, 148/1.5, 317/235 R

[51] Int. Cl. ..................H01l 7/44

[58] Field of Search ..................148/1.5, 187; 317/235

[56] References Cited

UNITED STATES PATENTS 3,479,237 11/1969 Bergh et al. ..................156/11

3,484,313 12/1969 Tauchi et al. ..................148/187

3,519,504 7/1970 Cuomo ..................148/187

*Primary Examiner*—L. Dewayne Rutledge

*Assistant Examiner*—J. M. Davis

*Attorney*—Vincent Rauner et al.

[57] ABSTRACT

A fine geometry, self-aligned device structure is fabricated by interspersing diffusion and pattern steps, including preferential etching, by which line widths of one micron, and pattern repeat distances of five microns in transistors, are easily attained.

2 Claims, 8 Drawing Figures

PROCESS FOR MAKING A FINE GEOMETRY, SELF-ALIGNED DEVICE STRUCTURE

BACKGROUND OF THE INVENTION

This invention relates to a method for making fine geometry structures in semiconductor devices.

There has been a long felt need in the art of constructing semiconductor components for methods of obtaining finer geometry structures. For example, the speed of response of a transistor is among other factors, a function of the width of the base and the perimeter-to-area ratio of the emitter. In a single transistor the prior art speed of response is measured in nanoseconds, but the single transistor speed of response must be multiplied many times to account for the number of switches which may be responding to an input signal in a computer operation. In space program applications particularly, fractions of a second may be crucial, so improving speed of response and, consequently, the geometry of the device, are of continuing concern.

The range of values for resistors is another example of a performance factor which is undesirably limited by the geometries produced by prior art processes.

The prior art capabilities could be improved if a process were available which could produce finer geometry devices. The emitter could be made as an ultra thin line; likewise the base could be narrowed. Similarly, the ideal geometry of a high value resistor (an infinitely thin, long line) could then be more nearly approached. Attempts were made in the prior art to approach the ideal. Finger shaped emitters are known, and thin line resistors doubling back upon themselves to gain length are known. But the prior art fingers and switch-backs have to be unnecessarily far apart and the lines have to be unnecessarily thick because the prior art tolerances are too gross to achieve the required fine geometries.

Another facet of the problem appears in the fabrication of the all-diffused monolithic structure which requires a set of at least three masks to form the active and passive components (not counting metallization). The process requires extremely close registration of the masks in successive masking and etching steps and the difficulty in achieving such close registration is also a limiting factor in working with very fine geometries. In addition to the difficulty in accomplishing close registration of masks, this popular prior art process presents difficulty in avoiding, or compensating for, mask imperfections.

SUMMARY OF THE INVENTION

On a suitable substrate there is formed a sandwich having a plurality of windows to the substrate. The sandwich is composed of dielectric substances which are subject to preferential etching to the exclusion of the substrate and each other. Once the sandwich is formed, the windows are cut by subjecting the sandwich to a standard photolithographic process.

Then a diffusion through the windows is made to define desired operative areas having a known underlap of the mask.

Then the first layer is undercut by preferential etching to a known extent, thus forming first layer islands which define precisely an adjacent area for subsequent diffusion.

The layers of the sandwich, except the first, are stripped off next. Then a layer of oxide is grown on the exposed substrate.

The islands of first layers are preferentially etched, thus exposing the substrate for a diffusion which is carried out using the oxide layer as a mask without further preparation.

Thus, adjacent diffusions may be made with line widths on the order of 1 micron. The brief description was in terms of sets of two diffused areas alternating, but more elaborate structures of equally fine geometry may be easily constructed. In comparison to the most recent state-of-the-art improvements which achieved line structure widths of 4 to 5 microns, the present invention achieves one micron width and with high reliability.

DETAILED DESCRIPTION

Figure 1:
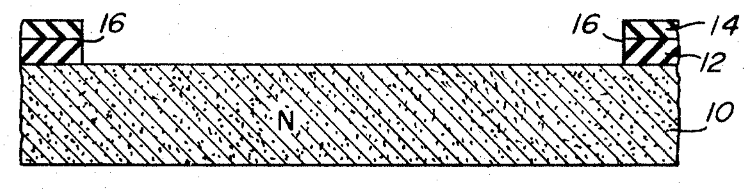

FIGS. 1 through 7 of the drawing illustrate in cross section the substrate of monocrystalline silicon as it is modified by the steps of the process. The figures are enlarged but not to scale.

Figure 4:
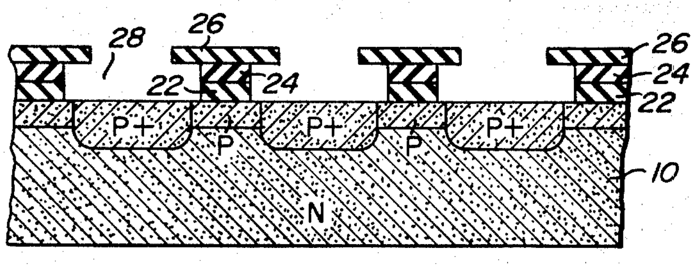
Figure 5:
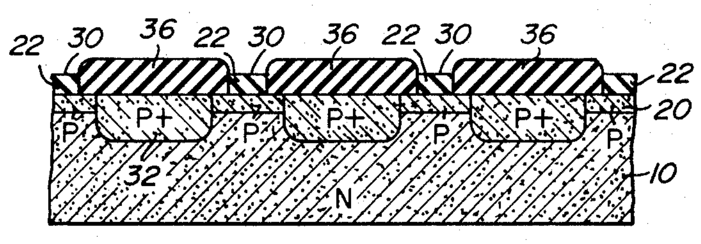
Figure 6:
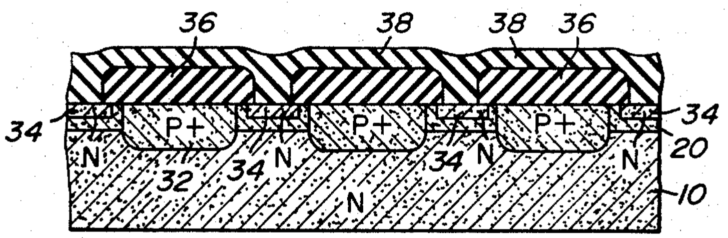
Figure 8:
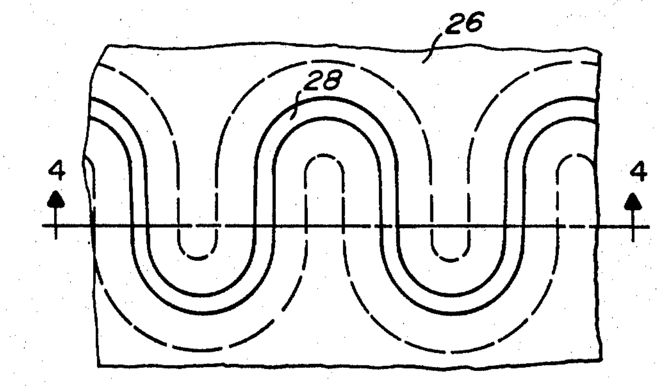

FIG. 8 is a plan view which illustrates the complementary self-aligning features of this process. The undercut boundary is shown in phantom outline. The view of FIG. 4 is a cross section of FIG. 8 taken along the line 4 — 4.

The structure made available by this invention is a very fine geometry pattern with automatically aligned complementary P-type and N-type diffusions. One micron line widths in one of the diffusions are easily fabricable and the complementary diffusions can be arbitrarily closely spaced, because the two areas are defined by etch-created patterns which preserve the original pattern relationship created by the mask. The etchant operates uniformly on the material being etched, thus preserving the original complementary relationship of the pattern. Slight imperfections are thereby rendered inconsequential. The automatic alignment feature insures that the diffusions are exactly the same distance apart at all points since they are fabricated with the same line on a photoresist mask. One micron line widths are obtained in the device using photoresist patterns no finer than 0.1 mil ($2.5\mu$).

The fabrication process described below is appropriate for attainment of a fine geometry NPN transistor, although the steps can be applied wherever two diffusions must be precisely aligned very close to each other.

Figure 2:
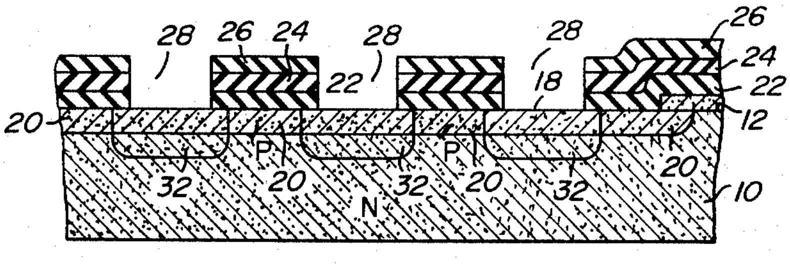
Figure 3:
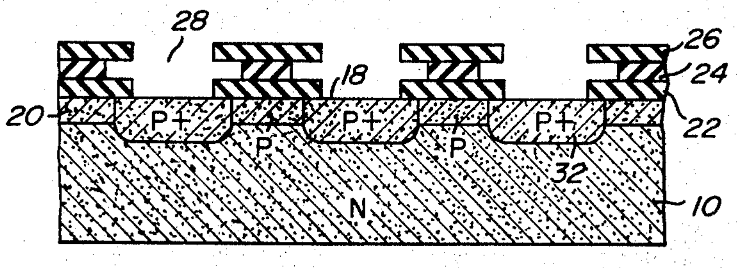

In this embodiment, an N-type silicon substrate which, as shown in the drawing, is a part of a larger wafer upon which thousands of repeat patterns may be formed simultaneously, is covered by a silicon dioxide layer 12. Then a layer of photoresist 14 is deposited over the silicon oxide in preparation for a standard photolithographic process. Using a standard photolithographic process, a window 16 is opened to the surface 18 of the substrate 10 and the photoresist layer 14 is removed chemically. As shown in FIG. 2 a base diffusion is made in the first window area using boron as an impurity to produce a P-type conductivity in that area. The first diffused area 20 serves as the base of a NPN transistor.

After the base diffusion, a sandwich of silicon nitride, polycrystalline silicon and silicon oxide layers 22, 24 and 26 is deposited (by techniques well known to the art) on the substrate surface 18 and the silicon dioxide layer 12 remaining after the first diffusion.

A double layer sandwich composed only of silicon nitride and silicon oxide deposited successively on the substrate may be used instead of the three layers 22, 24, and 26. Likewise a suitable refractory metal may be used in place of the silicon nitride. A limiting factor is that the first layer 22 must be a substance which will not oxidize at high temperatures, whereas the substrate must exhibit that property, as will appear from the description. It is preferred to use the triple layer sandwich, however, because of the observed fact that the nitride layer becomes hardened after a P+ or other high temperature diffusion and therefore does not etch uniformly. Moreover, oxide and nitride layers tend to interact detrimentally at their interface. Other substitutions for the substrate and oxide will occur to those skilled in the art, bearing in mind the requirements taught herein.

Another photolithographic cycle is performed to create a second window 28 which opens to the substrate surface 18. The new photoresist layer (not shown) is stripped and the polycrystalline silicon layer 24 is undercut to create a one micron island 30 by etching with potassium hydroxide. This accomplishes the purpose of insulating the first and third layers 22, 26 to prevent their interreaction and etches uniformly to the desired pattern and dimensions, later serving as a mask for a silicon nitride etch. It is within the knowledge of persons skilled in the art to control the extent of the etch by manipulating the parameters of concentration, time of exposure and temperature appropriate to the etchant selected. This step in the process must be carefully done because of the relationship of the area defined by the island 30 remaining, after the etch step, to an area to be diffused 34.

A second diffusion of boron is performed to create a deeper and more heavily boron doped P+ type second diffused area 32. using a known technique including a shallow predeposition and high temperature drive-in. Any oxide formed in the second diffusion process (which is likely in the high temperature diffusion of P+ impurities) is washed out with dilute hydrofluoric acid, taking with it a thin, unimportant surface film of the outer oxide layer. The means for determining precisely the depth and lateral spread of the diffused area 32 relative the surface of the substrate 10 and the perimeter of the window 28 is also known in the prior art. The concentration of the impurity, the time of the exposure and the temperature are suitably adjusted to produce the desired depth and width.

At this point the second diffused area underlaps the substrate surface 18 masked by the sandwich. The exact extent of this underlap and the depth of the diffusion is accurately known because the diffusion process is precisely controlled as described.

Following the P+ diffusion, the first layer 22 is etched using the second layer 24 as a mask. Then the third layer 26 is stripped off and the second layer (of polycrystalline silicon) 24 is etched away with potassium hydroxide, which does not appreciably attack monocrystalline silicon, or silicon nitride.

An oxide 36 is next grown on the exposed substrate 10 by heating it at elevated temperatures, as known in the art. The first layer 22 is then removed by preferential etching with hot phosphoric acid and an emitter diffusion in area 34 is performed on the substrate 10 exposed by the removal of the first layer 22, using the oxide as a mask to protect the substrate not intended to be diffused. Next a coat of polycrystalline silicon 38 is grown on the exposed substrate 10.

Figure 7:
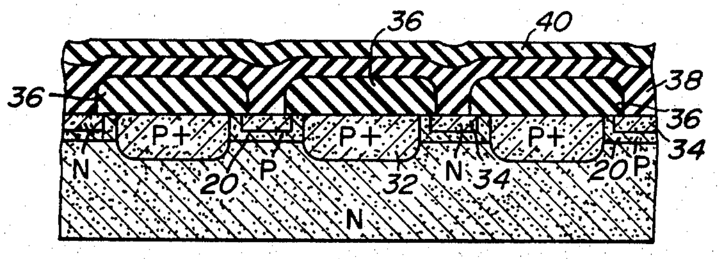

Thereafter a standard base pre-ohmic is performed, followed by a polycrystalline silicon etch and metallization as required. As shown in FIG. 7 the device is overlay geometry and base contact is made at the ends of the emitter fingers (not shown.) The emitter metal 40 makes contact to the heavily doped polycrystalline silicon. In the process described above, the pattern repeat distance is 5 microns wide. The emitter is 1 micron wide, the base contact diffusion is 3½ microns wide and the spacing from emitter to base contact is 0.5 micron. The base-emitter spacing is uniform along the entire device periphery, without regard to mask or photoresist imperfections.

Although only one illustrative embodiment has been described, it will be clear to persons ordinarily skilled in the art that various substitutions and modifications in the described process can be made without departing from the scope and spirit of the invention which is bounded by the following claims.

What is claimed is:

1. A process for producing a fine geometry, self-aligned semiconductor structure having complementary, self-aligned N-type and P-type areas, which comprises:

providing a substrate having a conductivity of one type;

forming a sandwich on said substrate having a plurality of layers comprising at least first and second layers of differing composition, each said layer preferentially etchable to the exclusion of the other layers and the substrate;

forming a plurality of windows to the substrate in said sandwich to define a first area to be diffused;

performing a controlled diffusion of said first area;

performing a controlled etch of said first layer of said sandwich to create an island of first layer defining a second area to be diffused complementary to said first diffused area;

removing said second layer;

growing a layer of oxide over the exposed substrate;

removing at least the portion of said first layer overlying said second area complementary to said first diffused area; and diffusing said second area.

2. The process of claim 1 wherein said plurality of layers comprises first, second the third layers of silicon nitride, polycrystalline silicon, and silicon dioxide respectively, and the additional steps of:

first etching said polysilicon layer to define said second complementary area before performing said first diffusion to insulate and protect said first and third layers from interreaction and to serve as a mask for a subsequent etch of said first layer; and etching said first layer, using the second layer as a mask, after the first diffusion.

* * * * *